US006627519B2

(12) United States Patent
Kwon et al.

(10) Patent No.: US 6,627,519 B2
(45) Date of Patent: Sep. 30, 2003

(54) METHOD OF MANUFACTURING AN SOI (SILICON ON INSULATOR) WAFER

(75) Inventors: Yong-Bum Kwon, Narae Maul Apt. 801-703, 1428, Dowon-Dong Daiseo-Gu, Daegu (KR), 704-793; Jong-Hyun Lee, Hyosung Apt. 106-802, 1071 Bongdok-Dong Nam-Gu, Daegu (KR), 705-751

(73) Assignees: Comtecs Co., Ltd., Daegu (KR); Yong-Bum Kwon, Daegu (KR); Jong-Hyun Lee, Daegu (KR)

( * ) Notice: Subject to any disclaimer, the term of this patent is extended or adjusted under 35 U.S.C. 154(b) by 22 days.

(21) Appl. No.: 09/963,440

(22) Filed: Sep. 27, 2001

(65) Prior Publication Data

US 2002/0094663 A1 Jul. 18, 2002

(30) Foreign Application Priority Data

Jan. 18, 2001 (KR) .................. 10-2001-0002840

(51) Int. Cl.[7] .......................... H01L 21/30; H01L 21/46
(52) U.S. Cl. ........................................ 438/459; 438/785
(58) Field of Search ................................ 438/149, 384, 438/478, 488, 679, 680, 683, 688, 455, 459, 406, 785, 977

(56) References Cited

U.S. PATENT DOCUMENTS

| 4,834,809 | A | * | 5/1989 | Kakihara ...................... 148/33 |
| 6,087,242 | A | * | 7/2000 | Maris et al. ................. 438/406 |
| 6,133,106 | A | * | 10/2000 | Evans et al. ................. 438/299 |
| 6,355,561 | B1 | * | 3/2002 | Sandhu et al. .............. 438/676 |
| 6,417,075 | B1 | * | 7/2002 | Haberger et al. ........... 438/459 |

* cited by examiner

Primary Examiner—Matthew Smith
Assistant Examiner—Calvin Lee
(74) Attorney, Agent, or Firm—Jacobson Holman PLLC

(57) ABSTRACT

This invention is to manufacturing of SOI (Silicon On Insulator) wafer; with respect to manufacturing of SOI wafer, preparation process of silicon wafer with desired thickness (100), deposition of Alumina ($Al_2O_3$) as insulator by an ALE (Atomic Layer Epitaxial) method such as ALCVD, ALD, ASCVD, etc ... (110), bonding of this wafer with another silicon wafer by various bonding methods (120), Cutting of this bonded wafer by various methods of cutting (130), Polishing the surface of the cut wafer (140). For the insulator material, titanium oxide ($TiO_2$) or tantalum oxide ($Ta_2O_5$) can be used other than Alumina ($Al_2O_3$) and such bonding process can be done by unibonding method and cutting method can be done by Smart Cut process.

2 Claims, 4 Drawing Sheets

METHOD OF MANUFACTURING AN SOI (SILICON ON INSULATOR) WAFER

BACKGROUND OF THE INVENTION

This invention is to suggest a different method of manufacturing SOI wafer and more specifically, to improve chemical, mechanical, and electrical properties of SOI wafer, to diversify the structure and composition of the wafer, and to improve on fabrication process of such wafers.

Silicon On Insulator type of wafers is widely used in wafer manufacturing process. This process is to form an insulator on top of the semiconductor wafer and then to form single crystal silicon layer before fabrication of semiconductor device.

SOI wafer is known to offer lateral and vertical isolation of integrated components and also to provide devices with superior electrical properties.

In a SOI wafer, two different processes are widely used in general. One of them is so called BE (Bond and Etch) method, which is to bond two wafers and etch back one of them in order to make a thin layer. The other is called SIMOX(Separation By Implantation of oxygen) method, which is to implant oxygen deep into the silicon wafer and form a buried oxide and a thin silicon layer by post-implantation heat treatment.

Smart Cut process is to implant hydrogen ions into an oxidized wafer A (through the insulator) by controlling the energy (depth) of hydrogen ions in order to control the film thickness. This wafer A is then bonded to another silicon wafer B. During subsequent annealing, bonded wafers separate at the region where the implanted hydrogen ions have stopped. This separation results in a thin Si film separated from the wafer B by a buried oxide. Finally, CMP process is applied in order to obtain a smoother surface and the desired thickness of the silicon film. This method is relatively easier than other processes such as SIMOX method and therefore, is being widely used recently.

In the Smart Cut technology mentioned above, the Smart Cut process disclosed in U.S. Pat. No. 5,882,987 (Smart Cut process with thin film semiconductor material on insulating film) claims to use CMP process in order to solve non-uniform surface problem and thin film formation problem, which are known problems associated with Smart Cut processes.

In case where $SiO_2$ is used as an insulation film, the thickness and quality of the buried insulator is controlled with conventional technologies (oxidation), as shown in FIG. 4. Since the chemical properties change by heating above 1000° C. in dry oxygen ambient (see table 4), such a control is not perfect.

SUMMARY OF THE INVENTION

The invention is to generate SOI wafer despite all the known problems associated with it. It is the purpose of this invention to improve the film properties, to generate uniform surface structure without requiring high process temperature, and to diversify the nature of the insulating film. This new invention of SOI wafer manufacturing method includes steps of: (100) Preparation of silicon wafers with designed thickness and diameter; (110) forming alumina ($Al_2O_3$) insulation film or other dielectric film on the surface of the prepared silicon wafer by atomic layer epitaxial method such as ALCVD, ALD, ASCVD, etc.; (120) Bonding this wafer with another silicon wafer (oxidized or not) by various methods; (130) Cutting one of the bonded wafers by various methods; (140) Polishing the cut surface of the wafer.

BRIEF DESCRIPTION OF THE DRAWINGS

These and other features, aspects and advantages of the present invention will become better understood with reference to the accompanying drawings, wherein.

DETAILED DESCRIPTION OF THE PREFERRED EMBODIMENT

Figure 1:
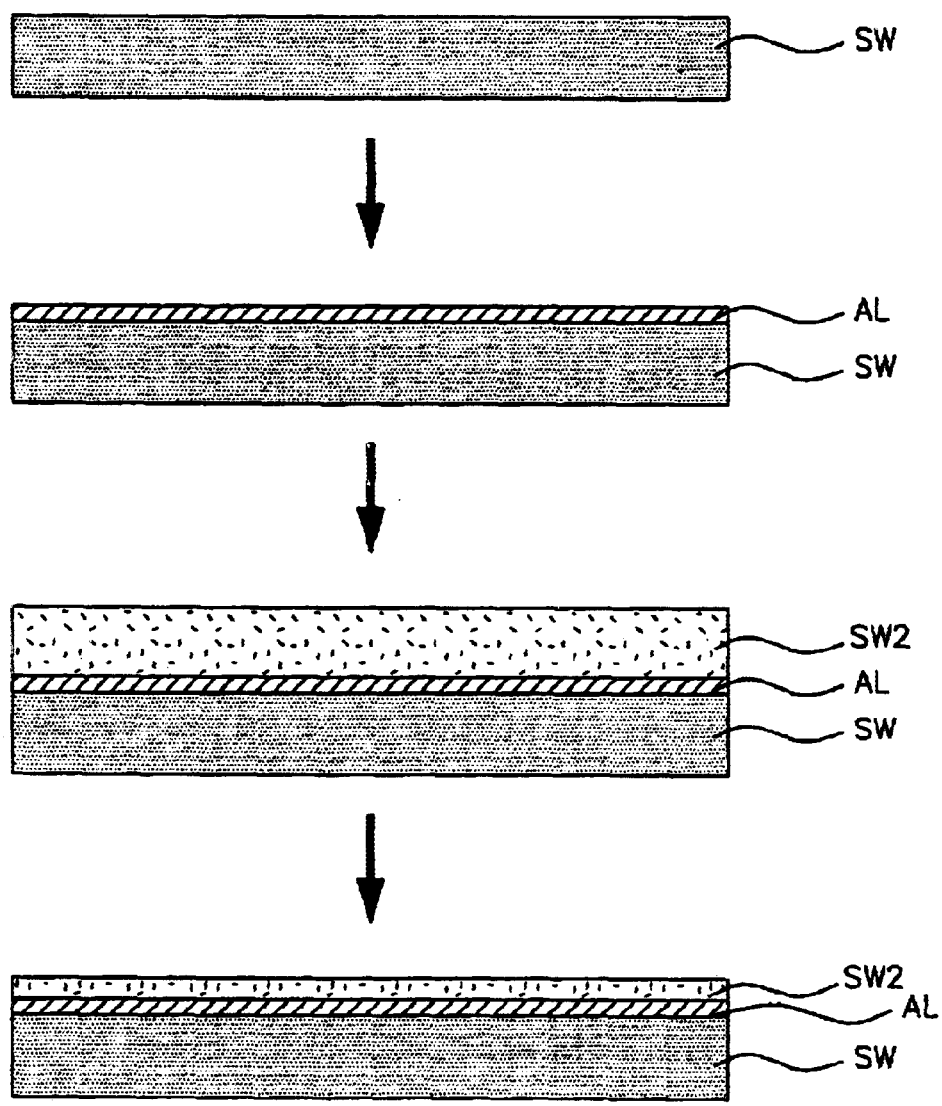
FIG. 1 indicates a partial side view of the wafer, showing sequential manufacturing process of the invention.
Figure 2:
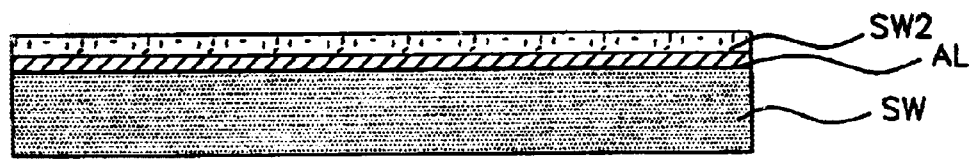
FIG. 2 indicates a partial side view of the wafer, done by the SOI wafer manufacturing process of the invention.
Figure 3:
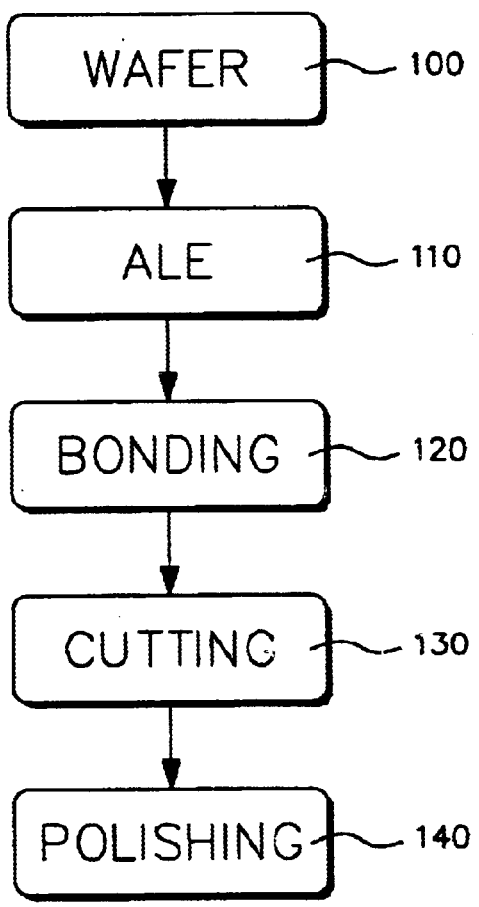
FIG. 3 indicates the process flowchart explaining the SOI wafer manufacturing process of the invention.
Figure 4:
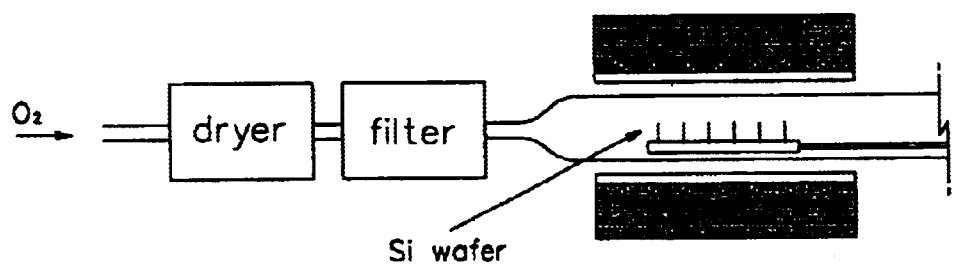
FIG. 4 represents a conventional $SiO_2$ film generating method.

The basic concept of the system configuration and methods of manufacturing are explained more in detail by the drawings. FIG. 1 indicates a partial side view of the wafer, showing sequential manufacturing process of the invention; FIG. 2 indicates a partial side view of the wafer, done by the SOI wafer manufacturing process of the invention; FIG. 3 indicates the process flowchart explaining the SOI wafer manufacturing process of the invention; and FIG. 4 represents conventional $SiO_2$ film generating method.

The characteristic of this invention is that various methods are used for bonding and cutting wafers in order to achieve SOI-like structures using dielectric films such as alumina ($Al_2O_3$), titanium oxide ($TiO_2$), tantulum oxide ($Ta_2O_5$), etc . These films are easy to fabricate by ALCVD and have more applications than conventional $SiO_2$ films in subsequent circuit integration processes. According to this invention, besides the conventional Smart Cut® processes, other methods can be used such as BE (Bond & Etch) and Eltran (Separation By using Porous Silicon). This invention uses alumina instead of $SiO_2$ and also utilizes atomic layer epitaxial method instead of conventional CVD process or oxygen implantation. Alumina is a lot easier to make thin films since it is more ductile and has greater conductivity than $SiO_2$. Furthermore, it's more corrosion-resistant due to its superior chemical reactivity than with $SiO_2$. Other key advantages are the better thermal conductivity and increased dielectric constant.

Other insulating materials suggested in this invention are titanium oxide($TiO_2$), tantalum oxide($Ta_2O_5$), hafnium oxide, etc. Their characteristics are known to be either similar or better than that of alumina($Al_2O_3$). One method of Atomic Layer Epitaxial (ALE) is a process where films are generated by stack of atomic layers using chemical absorption and desorption. ALE is preferred since it is by using surface saturated reaction to deposit the desired material by sequential deposition in order to produce very thin film thus able to achieve precise control of film thickness. The main difference as compared to conventional silicon-on-sapphire material is that instead of growing Si on Sapphire (which generates many defects), in this invention alumina is grown on silicon.

By using the proposed method in this invention, it is possible to generate alumina films at below 700° C. which is significantly lower than 1000° C. required for $SiO_2$ film, with 1000 times less current leakage rate than that of $SiO_2$ film. Furthermore, the life of the film is increased due to corrosion-resistant characteristics of alumina film, and it is also possible to vary the film aracteristics by varying the film thickness due to precise control of atomic layers.

The following is a detailed description of the exemplary embodiment and only is an example of this invention. Other ideas and purpose can be derived from this invention and such derivatives are all included within the technical aspect of this invention.

[Embodiment]

Process 1:

(100) Prepare a silicon wafer with desired thickness/diameter

Process 2:

(110) Generate alumina film (or other dielectric) as an insulator on top of the wafer via ALE process such as ALCVD, ALD, ASCVD, etc.

Process 3:

(120) Bonding the first wafer, having the alumina insulator, with another silicon wafer (oxidized or not) via Unibond® or other bonding methods Process 4:

(130) Cut one of the bonded wafers via Smart Cut® method or other cutting methods Process 5

(140) Polish the cut surface of the bonded wafers to make it smooth. This new method of manufacturing SOI water is by using alumina, titanium oxide, tantalum oxide or other oxides instead of $SiO_2$ as insulator. The new SOI wafers will be fabricated with less than ⅔ of the heat required for $SiO_2$ process. By doing so, it is possible to achieve both cost reduction and superior characteristics of the Si film and buried dielectric (high thermal conductivity and dielectric constant, good quality Si—$Al_2O_3$ interface, etc.)

In this new manufacturing method, leakage current can be reduced more than 1000 times, as compared to $SiO_2$, thus achieving significant improvement in electrical properties and flexibility.

In addition, improvement in design application and longer lifetime can be achieved by utilizing the ability of the ALCVD process to control atomic scale level and high breakdown voltage.

It will be apparent to those skilled in the art that various controls and variations can be made in the present invention without deviating from the spirit or scope of the invention. Thus, it is intended that the present invention covers the controls and variations of this invention provided they come within the scope of the appended claims and their equivalents.

What is claimed is:

1. A method of manufacturing an SOI (Silicon On Insulator) wafer, comprising the steps of:

preparing a first silicon wafer with designed thickness and diameter;

forming alumina ($Al_2O_3$) or other dielectric as an insulator layer on the surface of the prepared first silicon wafer by ALE process such as ALCVD, ALD, ASCVD, thereby forming a first resulting structure;

bonding a second silicon wafer on the alumina of the first resulting structure by a bonding method, thereby forming a second resulting structure;

cutting the bonded second resulting structure by a cutting method, thereby forming a third resulting structure; and polishing the surface of the third resulting structure.

2. The method of claim 1, wherein subject of said insulator layer can be titanium oxide ($TiO_2$) and tantalum oxide ($Ta_2O_5$) instead of alumina ($Al_2O_3$).

* * * * *